(12) United States Patent
Kido et al.

(10) Patent No.: US 6,436,835 B1
(45) Date of Patent: Aug. 20, 2002

(54) COMPOSITION FOR POLISHING A SEMICONDUCTOR DEVICE AND PROCESS FOR MANUFACTURING A SEMICONDUCTOR DEVICE USING THE SAME

(75) Inventors: Takanori Kido; Kagetaka Ichikawa, both of Shiojiri (JP)

(73) Assignee: Showa Denko K.K., Tokyo (JP)

( * ) Notice: Subject to any disclaimer, the term of this patent is extended or adjusted under 35 U.S.C. 154(b) by 0 days.

(21) Appl. No.: 09/622,939

(22) PCT Filed: Feb. 24, 1999

(86) PCT No.: PCT/JP99/00844

§ 371 (c)(1),
(2), (4) Date: Aug. 24, 2000

(87) PCT Pub. No.: WO99/43761

PCT Pub. Date: Sep. 2, 1999

(30) Foreign Application Priority Data

Feb. 24, 1998 (JP) .............................................. 10-42288

(51) Int. Cl.$^7$ .............................................. H01L 21/302
(52) U.S. Cl. .................................................... 438/693
(58) Field of Search ................. 438/693, 756, 438/757, 970

(56) References Cited

U.S. PATENT DOCUMENTS 5,733,819 A * 3/1998 Kodama et al. ............ 438/692
6,045,605 A * 4/2000 Doi et al. ....................... 106/3
6,069,083 A * 5/2000 Miyashita et al. .......... 438/693

FOREIGN PATENT DOCUMENTS

| EP | 0 786 504 A2 | 7/1997 | ............ C09G/1/02 |
| EP | 0 786 504 A3 | 5/1998 | ............ C09G/1/02 |
| EP | 1 043 379 A1 | 10/2000 | ............ C09K/3/14 |
| JP | 8-41443 | 2/1996 | ............ C09K/3/14 |
| JP | 8-302338 | 11/1996 | ............ C09K/3/14 |
| JP | 9-137156 | 5/1997 | ............ C09K/3/14 |
| JP | 9-194823 | 7/1997 | ............ C09K/3/14 |
| JP | 9-208933 | 8/1997 | ............ C09K/3/14 |
| JP | 10-279928 | 10/1998 | ............ C09K/3/14 |
| WO | 98/113218 | 4/1998 | ............ C09K/13/00 |

OTHER PUBLICATIONS

Patent Abstracts of Japan 08302338 A Nov. 19, 1996.
Patent Abstracts of Japan 08041443 A Feb. 13, 1996.
Patent Abstracts of Japan 09137156 A May 27, 1997.

* cited by examiner

Primary Examiner—Hoai V. Ho
Assistant Examiner—Quoc Hoang
(74) Attorney, Agent, or Firm—Sughrue Mion, PLLC

(57) ABSTRACT

An abrasive composition for polishing a semiconductor device, comprising cerium oxide, a water-soluble organic compound having at least one group of —COOH, —COOM$_x$ (wherein M$_x$ is an atom or a functional group capable of substituting a H atom to form a salt), —SO$_3$H or —SO$_3$M$_Y$ (wherein M$_Y$ is an atom or a functional group capable of substituting a H atom to form a salt), and water a process for forming shallow trench isolations using this abrasive composition.

2 Claims, 1 Drawing Sheet

COMPOSITION FOR POLISHING A SEMICONDUCTOR DEVICE AND PROCESS FOR MANUFACTURING A SEMICONDUCTOR DEVICE USING THE SAME

TECHNICAL FIELD

The present invention relates to an abrasive composition for polishing a semiconductor device, more specifically, to an abrasive composition for use in element isolation of a semiconductor device by the shallow trench isolation process, as well as a process for manufacturing a semiconductor device using said abrasive composition.

BACKGROUND ART

As a method for isolating elements of a semiconductor device, a great deal of attention is shifting from the LOCOS (Local Oxidation of Silicon) process toward a shallow trench isolation process where a silicon nitride layer is formed on a silicon substrate, shallow trenches are formed and oxide layer is deposited thereon and then planarized by the CMP technique using the silicon nitride layer as a stopper, as the effective element region is wide and higher density semiconductor device can be fabricated.

In many of the shallow trench isolation processes, a silicon nitride layer is formed as lower layer of the oxide layer to be polished, the silicon nitride layer is used as the stopper in the polishing, the surface to be planarized is polished to give uniform and exact removed thickness, and the polishing is finished when a predetermined thickness removed is reached.

As the abrasive composition used to this effect, JP-A-9-194823 describes a composition using silicon nitride, silicon carbide or graphite as the particulate abrasive and JP-A-208933 describes an abrasive composition comprising silicon nitride fine powder having added thereto an acid such as gluconic acid.

These abrasive compositions contain an abrasive having high hardness and certainly ensure a high polishing rate, however, they are disadvantageous in that many scratches are generated on the polished surface and give rise to reduction in the performance of the semiconductor device.

Furthermore, the above-described techniques are sufficient in the "selectivity ratio" which is value obtained by dividing the polishing rate for an oxide layer by the polishing rate for a silicon nitride layer and shows how easy the oxide layer, in many cases, silicon dioxide layer is polished as compared with the silicon nitride stopper layer. Thus, there is a need to increase the selectivity ratio.

The object of the present invention is to provide an abrasive composition for polishing a semiconductor device, which can overcome the above-described problems.

Another object of the present invention is to provide a semiconductor device, which have solved the above-described problems.

DISCLOSURE OF THE INVENTION

As a result of extensive investigations to solve those problems, the present inventors have found (1) an abrasive composition for polishing a semiconductor device in the shallow trench isolation process, said composition mainly comprising water, cerium oxide powder and one or more water-soluble organic compound having at least one of a —COOH group, a —COOM$_X$ group (wherein M$_X$ is an atom or functional group capable of displacing a H atom to form a salt), a —SO$_3$H group and a —SO$_3$M$_Y$ group (wherein M$_Y$ represents an atom or functional group capable of displacing a H atom to form a salt).

Preferably, by using the abrasive composition for manufacturing a semiconductor device of the present invention, (2) wherein the concentration of cerium oxide in the abrasive composition is from 0.1 to 10% wt % and the amount of the water-soluble organic compound added, in terms of weight ratio to the cerium oxide, is from 0.001 to 20, and (3) wherein when a silicon nitride layer and a silicon oxide layer separately formed on a silicon substrate by the CVD method are independently polished under the same conditions, the ratio of the polishing rate for the latter to that for the former is 10 or more, the scratches on the polished surface can be significantly reduced and the value of the selectivity ratio can significantly increase.

The present invention also provides a process for manufacturing a semiconductor device, comprising the steps of forming a silicon nitride layer on a semiconductor substrate, selectively removing a portion of said silicon nitride layer to expose said semiconductor substrate, etching said semiconductor substrate using said silicon nitride layer as a mask to form a trench, depositing a silicon oxide layer on said silicon nitride layer and said semiconductor substrate to completely fill said trench with the silicon oxide layer, and planarization-polishing said silicon oxide layer using said silicon nitride layer as a stopper to selectively remain said silicon oxide layer in said trench, wherein said planarization-polishing is performed using an abrasive composition for polishing a semiconductor device, said composition mainly comprising water, cerium oxide powder and one or more water soluble organic compound having at least one of a —COOH group, —COOM$_X$ group (wherein M$_X$ is an atom or functional group capable of replacing a H atom to form a salt), a —SO$_3$H group or a —SO$_3$M$_y$ group (wherein M$_y$ is an atom or functional group capable of replacing a H atom to form a salt).

In this process, shallow trench isolation can be formed with reduced scratches on the polished surface with a high controllability.

BEST MODES FOR CARRYING OUT THE INVENTION

Figure 1:
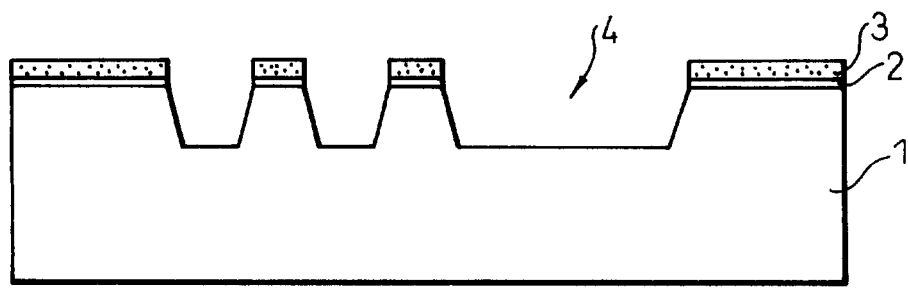
FIGS. 1–4 are cross-sectional views of a semiconductor device in the order of the steps for illustrating a process for forming a shallow trench isolation.

The abrasive composition for polishing a semiconductor device of the present invention is first described.

The cerium oxide fine powder used in the present invention is preferably in a high purity, specifically, the purity is preferably 99 wt % or more, more preferably 99.9 wt % or more. If the purity is less than this range, it is difficult to remove the impurity elements having adverse effects on the properties of the semiconductor from the surface of the semiconductor device even if the semiconductor device after the polishing is cleaned, as a result, defectives increase and the yield disadvantageously decreases.

The average particle size of the cerium oxide fine powder is preferably from 0.01 to 1.0 μm, more preferably from 0.1 to 0.5 μm. If the average particle size is less than 0.01 μm, the polishing rate for the oxide layer, in many cases, silicon dioxide layer, is reduced, whereas if it exceeds 1.0 μm, fine scratches are readily generated on the polished surface.

The primary particle size of cerium oxide is preferably from 0.005 to 0.5 μm, more preferably from 0.02 to 0.2 μm.

If the primary particle size is less then 0.005 µm, the polishing rate for the oxide layer is extremely reduced and a sufficiently large selectivity ratio cannot be attained, whereas if it exceeds 0.5 µm, fine scratches are readily generated on the polished surface.

The concentration of cerium oxide (fine powder) in the abrasive composition of the present invention depends on the polishing conditions such as working pressure, however, it is preferably from 0.1 to 10 wt %, more preferably from 0.3 to 5 wt %. If the concentration is less than 0.1 wt %, the polishing rate for the oxide layer is reduced, whereas even if it exceeds 10 wt %, improvement in the effect, namely, improvement of the polishing rate for the oxide layer is not enhanced by the increase in the concentration and profitability disadvantageously decreases.

The water-soluble organic compound for use in the present invention is described below.

This is a water-soluble organic compound having at least one of —COOH group, —COOM$_X$ group (wherein M$_x$ is an atom or functional group capable of displacing a H atom to form a salt), —SO$_3$H group and a —SO$_3$M$_Y$ group (wherein M$_Y$ is an atom or functional group capable of displacing a H atom to form a salt). In the case of a salt, an alkali metal is preferably not contained. The water-soluble organic compound for use in the present invention is not particularly limited as far as it has at least one of the above-described groups. The water-soluble organic compound may be used alone or in combination.

Specific preferred examples thereof include polyacrylic acid (–(CH$_2$CHCOOH–)$_n$, molecular weight: 500–10000), polymethacrylic acid (–(CH$_2$CCH$_3$COOH–)$_n$, molecular weight: 500–10000), ammonium salts thereof, naphthalenesulfonic acid-formalin condensate (the following formula:

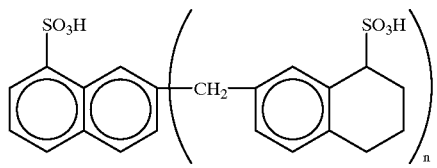

molecular weight: 500–10000), ammonium salt thereof, as well as, malic acid (HOOCCH(OH)CH$_2$COOH, molecular weight: 134.90), lactic acid (CH$_3$CH(OH)COOH, molecular weight: 90.08), tartaric acid (HOOC(CHOH)$_3$COOH, molecular weight: 150.09), gluconic acid (HOCH$_2$(HCOH)$_4$COOH, molecular weight: 196.16), citric acid monohydrate (HOOCCH$_2$C(OH) (COOH)CH$_2$COOH.H$_2$O, molecular weight: 210.14), succinic acid (HOOC(CH$_2$)$_2$COOH, molecular weight: 118.09), adipic acid (HOOC(CH$_2$)$_4$COOH, molecular weight: 146.14), fumaric acid (HOOCCH=CHCOOH, molecular weight: 116.07) and other organic acids, ammonium salts thereof, aspartic acid (HOOCCH$_2$CH(NH$_2$)COOH, molecular weight, 133.10), glutamic acid (HOOCCH$_2$CH$_2$CH(NH$_2$)COOH, molecular weight: 147.13) and other acidic amino acids, ammonium salts thereof, glycine (H$_2$NCH$_2$COOH, molecular weight: 75.07), 4-aminobutyric acid (H$_2$N(CH$_2$)$_3$COOH, molecular weight: 103.12), 6-aminohexanoic acid (H$_2$N(CH$_2$)$_5$COOH, molecular weight: 131.17), 12-aminolauric acid (H$_2$N(CH$_2$)$_{11}$COOH, molecular weight: 215.33), arginine (H$_2$NC(=NH)NH(CH$_2$)$_3$CH(NH$_3$)COOH, molecular weight: 174.20), glycylglycine (H$_2$NCH$_2$CONHCH$_2$COOH, molecular weight: 132.12) and other neutral or base amino acids, laurylbenzene sulfonic acid (CH$_3$(CH$_2$)$_{11}$C$_6$H$_4$SO$_3$H, molecular weight: 326.50), and ammonium salt thereof, etc.

The amount of the water-soluble organic compound added varies depending on the kind of the compound, the concentration of the cerium oxide fine powder in the composition of the present invention, the pH value of the composition or the polishing conditions such as working pressure, however, it is preferably in terms of the weight ratio to the cerium oxide, from 0.001 to 20, more preferably from 0.005 to 10, still more preferably from 0.005 to 5. If the weight ratio is less than 0.001, the amount of the water-soluble organic compound adsorbing to the surface of the silicon nitride layer is small as compared with the abrasive grain working in the polishing process and a poor adsorption layer is formed, as a result, the effect of preventing the direct contact of the cerium oxide fine powder with the silicon nitride layer is not sufficiently large and the polishing rate for the silicon nitride layer cannot be reduced, whereas even if it exceeds 20, the effect is no more enhanced by the increase in the amount and profitability disadvantageously decreases.

The pH of the abrasive composition of the present invention is next described.

The pH can be controlled if necessary since it has an influence to the polishing rates of both the silicon dioxide layer and the silicon nitride. If the pH is to be lowered, inorganic acids such as nitric acid, hydrochloric acid and sulfonic acid, organic acids such as malic acid, lactic acid, tartaric acid, gluconic acid, citric acid monohydrate, succinic acid, adipic acid and fumaric acid, and acidic amino acids such as aspartic acid and glutamicacid may be used. If the pH is to be increased, ammonia, amines such as ethanolamine, or neutral or basic amino acids such as glycine, 4-aminobutyric acid, 6-aminohexanoic acid, 12-aminolauric acid, argiric acid and glycylglycine may be used. The pH of 4 or more is preferable in some cases but the pH of less than 4 may be used.

The abrasive composition of the present invention may further contain an abrasive other than cerium oxide, and additives commonly used in abrasive compositions, such as a viscosity adjusting agent, a buffer, a surface active agent and a chelating agent.

The abrasive composition of the present invention is characterized by a high selectivity in the polishing rate between silicon oxide and silicon nitride and the selectivity ration can be at least 10, preferably 30 or more and more preferably 50 or more. In addition, it is characterized by great decrease in scratches to the polished surface.

The process for formation of shallow trench isolation in a semiconductor device using the abrasive composition is now described.

The drawings are referred to. As shown in FIG. 1, the surface of a semiconductor substrate such as silicon is oxidized to form a thin silicon oxide layer 2, on which a silicon nitride layer 3 is deposited, at a thickness of, for example, 200 nm by CVD. By photolithography using a photoresist, for example, openings 4 with a width of, for example 500–5000 nm is formed on the silicon nitride layer at locations where trenches are to be formed.

Using the silicon nitride layer 3 with the openings as a mask, the semiconductor substrate 1 is subjected to selective etching to form shallow trenches having a depth of, for example, 500 nm.

Figure 2:
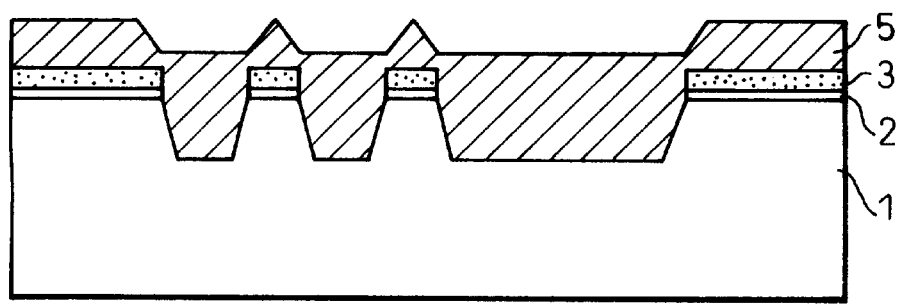

Silicon oxide 5 is deposited on the entire surface of the semiconductor substrate 1 having thereon the silicon nitride layer 3, for example, by the bias CVD method which allow an excellent filling property, so that the trenches 4 can be completely filled with the silicon oxide 5 (FIG. 2).

Figure 3:
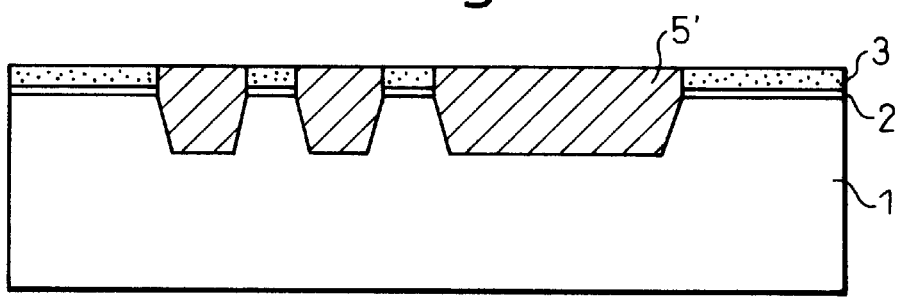
Figure 4:
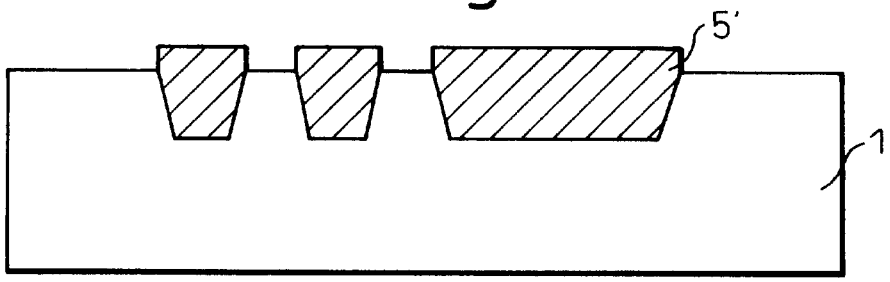

If planarization-polishing using an abrasive composition is effected on this construction, the surface of the silicon oxide layer 5 is gradually polished as a planar surface in spite of the presence of the recess portions on the trenches 4. As the polishing is continued, the polished surface reaches the surface of the silicon nitride layer 3, before which the surface becomes completely planar and the recesses on the trenches disappear. The polishing is finished at the stage when the surface of the silicon nitride layer 3 is exposed. Thus, the shallow trench isolations 5' are formed as shown in FIG. 3. The silicon nitride layer 3 may be used as an insulating layer on the semiconductor device, but is usually removed as shown in FIG. 4.

In the planarization-polishing for formation of shallow trench isolation as described above, the ratio of the polishing ratio of silicon oxide to silicon nitride, i.e., the selectivity ratio, should be high in order to effectively polish the silicon oxide and to ensure stopping of polishing at the location of the silicon nitride. Also, it is not desired if there are scratches on the polished surface since they may cause deterioration of the characteristics of the semiconductor device.

The abrasive composition of the present invention described before was developed to provide a most adequate composition for the planarization-polishing. With the abrasive composition of the present invention, at least 10, preferably 50 or more, even 60 or more of said selectivity ratio can be obtained, by which highly controlled planarization-polishing can be made and prevention of scratches on the polished surface can be also attained.

The method of carrying out of the polishing using the abrasive composition of the present invention may be any known polishing method or mechanochemical polishing method.

EXAMPLES

The present invention is described in greater detail below by referring to the Examples, however, the present invention should not be construed as being limited thereto.

Example 1

100 g of high-purity cerium oxide slurry (GPL-C1010, produced by Showa Denko KK, $d_{50}$=0.5 μm, primary particle size: 0.1 μm, concentration of cerium oxide having a purity of 99.9 wt % or more: 10 wt %) was mixed with 100 g of a solution obtained by dissolving 10 g of ammonium polyacrylate in water. Water was further added thereto to prepare a slurried abrasive composition in a total amount of 1,000 g. The composition obtained had a pH of 7.2, a cerium oxide concentration of 1 wt % and an ammonium polyacrylate concentration of 1 wt %. The amount of the water-soluble organic compound added, in terms of the weight ratio to the cerium oxide, was 1.0.

The polishing performance of this abrasive slurry for the silicon dioxide layer and for the silicon nitride layer was evaluated as follows:

[Polishing Conditions]

Material Polished (1) silicon dioxide layer (thickness: about 1 μm) formed on a silicon wafer having a diameter of 6" and a thickness of 625 μm by the CVD method (2) silicon nitride layer (thickness: about 0.5 μm) formed on a silicon wafer having a diameter of 6" and a thickness of 625 μm by the CVD method Pad: two layer-type pad for polishing a semiconductor device (IC1000/Suba400, manufactured by Rodel-Nitta Co., Ltd.)

Polishing Machine:

single side polishing machine for polishing a semiconductor device (Model SH-24, manufactured by Speedfam Co., Ltd., work table diameter: 610 mm)

Revolution Number of Table: 70 rpm

Working Pressure: 300 gf/cm$^2$

Slurry Feeding Rate: 100 ml/min

Polishing Time: 1 min

[Evaluation Item and Evaluation Method]

Polishing Rate: light interference-type layer thickness measuring apparatus

Scratch: optical microscope dark-field observation (3% of the wafer surface was observed at 200 magnification and the number of scratches were converted into pieces/wafer)

As a result of the above-described polishing test, the polishing rate for the silicon dioxide layer was high and 5,050 Å/min and the polishing rate for the silicon nitride layer was extremely low and 77 Å/min. Accordingly, the selectivity ratio was as high as 66.

Scratches were not observed either on the silicon dioxide layer or silicon nitride layer.

Examples 2 to 9

Slurries were prepared in the same conditions as in Example 1 except for changing the cerium oxide concentration and the ammonium polyacrylate concentration, and then, evaluated on the polishing performance in the same manner as in Example 1. The results are shown in Table 1 together with the results of Example 1.

Examples 10 to 15

Slurries were prepared using the same cerium oxide as used in Example 1 but changing the kind of the aqueous organic compound. The cerium oxide concentration and the water-soluble organic compound concentration were set to be the same and each was 1 wt %. The weight ratio therebetween was accordingly 1. The pH of each abrasive slurry was adjusted to be about 7 by adding ammonia. The polishing performance was evaluated in the same manner as in Example 1 and the results obtained are shown in Table 2.

Examples 16 to 23

Slurries were prepared using the same cerium oxide as used in Example 1 but changing the kind of the aqueous organic compound. The cerium oxide concentration and the water-soluble organic compound concentration were set to be the same and each was 1 wt %. The weight ratio therebetween was accordingly 1. The polishing performance was evaluated in the same manner as in Example 1 and the results obtained are shown in Table 3.

Comparative Example 1

A slurry of 10 wt % was prepared by diluting a silica slurry (SC-1, produced by Cabot Corporation, 30 wt %) and evaluated on the polishing performance. The results are shown in Table 3.

Comparative Example 2

A slurry of 1 wt % was prepared by diluting the same cerium oxide as used in Example 1. The water-soluble organic compound was not added. The polishing test was performed in the same manner as in Example 1 and the results are shown in Table 3.

As seen from the results, when silicon nitride layer and silicon oxide layer separately formed on a silicon substrate by the CVD method were independently polished under the same conditions, the ratio of the polishing rate for the latter to that for the former, namely, the selectivity ratio greatly exceeded 10 in the case of the present invention.

TABLE 1

| Example No. | Cerium Oxide Concentration (wt %) | Ammonium Polyacrylate Concentration (wt %) | Weight Ratio | pH of Slurry | Polishing Rate for Silicon Dioxide Layer (Å/min) | Polishing Rate for Silicon Nitride Layer (Å/min) | Selectivity Ratio | Scratches on Polished Surface (pieces/wafer) Silicon Dioxide Layer | Scratches on Polished Surface (pieces/wafer) Silicon Nitride Layer |
|---|---|---|---|---|---|---|---|---|---|
| 1 | 1 | 1 | 1 | 7.2 | 5050 | 77 | 66 | 0 | 0 |
| 2 | 1 | 0.2 | 0.2 | 7.1 | 5920 | 170 | 35 | 0 | 0 |
| 3 | 1 | 0.5 | 0.5 | 7.2 | 5180 | 81 | 64 | 0 | 0 |
| 4 | 1 | 2 | 2 | 7.2 | 3720 | 76 | 49 | 0 | 0 |
| 5 | 0.5 | 0.2 | 0.4 | 7.4 | 3370 | 70 | 48 | 0 | 0 |
| 6 | 0.5 | 0.5 | 1 | 7.2 | 3290 | 64 | 51 | 0 | 0 |
| 7 | 0.5 | 1 | 2 | 7.0 | 3010 | 60 | 50 | 0 | 0 |
| 8 | 2 | 2 | 1 | 7.3 | 6240 | 110 | 57 | 0 | 0 |
| 9 | 2 | 4 | 2 | 7.1 | 5990 | 110 | 54 | 0 | 0 |

TABLE 2

| Example No. | Water-Soluble Organic Compound | pH of Slurry | Polishing Rate for Silicon Dioxide Layer (Å/min) | Polishing Rate for Silicon Nitride Layer (Å/min) | Selectivity Ratio | Scratches on Polished Surface (pieces/wafer) Silicon Dioxide Layer | Scratches on Polished Surface (pieces/wafer) Silicon Nitride Layer |
|---|---|---|---|---|---|---|---|
| 10 | polymethacrylic acid | 7.8 | 5280 | 83 | 64 | 0 | 0 |
| 11 | naphthalenesulfonic acid formalin condensate | 8.2 | 5760 | 98 | 59 | 0 | 0 |
| 12 | malic acid | 7.3 | 3970 | 91 | 44 | 0 | 0 |
| 13 | lactic acid | 7.0 | 6010 | 120 | 50 | 0 | 0 |
| 14 | tartaric acid | 6.2 | 3560 | 70 | 51 | 0 | 0 |
| 15 | laurylbenzenesulfonic acid | 7.5 | 5040 | 82 | 61 | 0 | 0 |

TABLE 3

| Example No. | Water-Soluble Organic Compound | pH of Slurry | Polishing Rate for Silicon Dioxide Layer (Å/min) | Polishing Rate for Silicon Nitride Layer (Å/min) | Selectivity Ratio | Scratches on Polished Surface (pieces/wafer) Silicon Dioxide Layer | Scratches on Polished Surface (pieces/wafer) Silicon Nitride Layer |
|---|---|---|---|---|---|---|---|
| 16 | aspartic acid | 3.2 | 2210 | 22 | 100 | 0 | 0 |
| 17 | glutamic acid | 3.3 | 3270 | 36 | 91 | 0 | 0 |
| 18 | malic acid | 2.8 | 2550 | 82 | 31 | 0 | 0 |
| 19 | lactic acid | 2.9 | 5010 | 61 | 82 | 0 | 0 |
| 20 | tartaric acid | 3.0 | 2790 | 58 | 48 | 0 | 0 |
| 21 | succinic acid | 3.2 | 4960 | 98 | 51 | 0 | 0 |
| 22 | fumaric acid | 2.6 | 3800 | 77 | 49 | 0 | 0 |
| 23 | adipic acid | 3.3 | 4090 | 91 | 45 | 0 | 0 |

TABLE 4

| Comparative Example No. | Constitution of Compound | Weight Ratio | pH of Slurry | Polishing Rate for Silicon Dioxide Layer (Å/min) | Polishing Rate for Silicon Nitride Layer (Å/min) | Selectivity Ratio | Scratches on Polished Surface (pieces/wafer) Silicon Dioxide Layer | Scratches on Polished Surface (pieces/wafer) Silicon Nitride Layer |
|---|---|---|---|---|---|---|---|---|
| 1 | Silica, 10 wt % | — | 10.3 | 1610 | 410 | 3.9 | 0 | 0 |
| 2 | Cerium oxide, 1 wt % | 0 | 7.0 | 6130 | 1050 | 5.8 | 0 | 0 |

INDUSTRIAL APPLICABILITY

The abrasive composition for polishing a semiconductor device of the present invention is high in the polishing rate for silicon dioxide as the oxide layer, has a large selectivity ratio to the polishing rate for silicon nitride layer, and is reduced in scratches generated on the polished surface, hence, is suited as a composition for polishing a semiconductor device, used in polishing the oxide layer, in many cases, silicon dioxide layer, with a silicon nitride layer as the stopper.

What is claimed is:

1. An abrasive composition for polishing a semiconductor device in the shallow trench isolation process, said composition mainly comprising water, cerium oxide powder (wherein the primary particle size of the cerium oxide powder is in a range of about 0.005 to 0.5 $\mu$m) and one or more water-soluble organic compounds having at least one of a —COOH group, a —COOM$_x$ group (wherein M$_x$ is an atom or functional group capable of displacing a H atom to form a salt), a —SO$_3$M$_y$ group (wherein M$_y$ represents an atom or functional group capable of displacing a H atom to form a salt), wherein when a silicon nitride layer and a silicon oxide layer separately formed on a silicon substrate by the CVD method are independently polished under the same conditions, the ratio of the polishing rate for the latter to the former is 10 or more.

2. The abrasive composition for polishing a semiconductor device as claimed in claim 1, wherein the concentration of cerium oxide in the abrasive composition is from 0.1 to 10 wt % and the amount of the water-soluble organic compound added, in terms of the weight ratio to the cerium oxide, is from 0.001 to 20.

* * * * *

UNITED STATES PATENT AND TRADEMARK OFFICE
CERTIFICATE OF CORRECTION

PATENT NO.   : 6,436,835 B1                                                             Page 1 of 1
DATED        : August 20, 2002
INVENTOR(S)  : Takanori Kido and Kagetaka Ichikawa It is certified that error appears in the above-identified patent and that said Letters Patent is hereby corrected as shown below:

<u>Title page,</u>
Item [63], insert:

-- Related U.S. Application Data

[60] Provisional Application No. 60/081,769, filed on April 15, 1998. --

Signed and Sealed this

Twenty-sixth Day of August, 2003

JAMES E. ROGAN
*Director of the United States Patent and Trademark Office*